(12) United States Patent
Shimonaka et al.

(10) Patent No.: US 6,778,574 B1
(45) Date of Patent: Aug. 17, 2004

(54) SEMICONDUCTOR LASER DEVICE AND ITS MANUFACTURING METHOD, AND OPTICAL COMMUNICATION SYSTEM AND OPTICAL SENSOR SYSTEM

(75) Inventors: Atsushi Shimonaka, Nara (JP); Hidenori Kawanishi, Nara (JP); Kazuhiro Emoto, Nagaokakyo (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/958,173

(22) PCT Filed: Apr. 5, 2000

(86) PCT No.: PCT/JP00/02207

§ 371 (c)(1),
(2), (4) Date: Jan. 7, 2002

(87) PCT Pub. No.: WO00/60711

PCT Pub. Date: Oct. 12, 2000

(30) Foreign Application Priority Data

Apr. 5, 1999 (JP) .............................. 11/098243

(51) Int. Cl.⁷ .............................. H01S 5/00; H01S 3/00
(52) U.S. Cl. .............................. 372/43; 372/36; 372/108
(58) Field of Search .............................. 372/36, 43, 108, 372/50

(56) References Cited

U.S. PATENT DOCUMENTS

| | | | |
|---|---|---|---|
| 5,535,230 A | * | 7/1996 | Abe .............................. 372/43 |
| 5,758,951 A | * | 6/1998 | Haitz .............................. 372/43 |
| 5,838,703 A | * | 11/1998 | Lebby et al. .............................. 372/43 |
| 5,905,750 A | * | 5/1999 | Lebby et al. .............................. 372/43 |
| 5,993,075 A | * | 11/1999 | Huang et al. .............................. 372/43 |
| 5,999,552 A | * | 12/1999 | Bogner et al. .............................. 372/43 |

FOREIGN PATENT DOCUMENTS

| | | |
|---|---|---|
| JP | 63-227092 | 9/1988 |
| JP | 3-8385 | 1/1991 |
| JP | 5-13887 | 2/1993 |
| JP | 6-53615 | 2/1994 |
| JP | 8-264885 | 10/1996 |
| JP | 8-331057 | 12/1996 |
| JP | 25475/1991 | 3/1997 |
| JP | 9-307174 | 11/1997 |
| JP | 10-105093 | 4/1998 |

* cited by examiner

Primary Examiner—Quyen P. Leung
(74) Attorney, Agent, or Firm—Birch, Stewart, Kolasch & Birch, LLP.

(57) ABSTRACT

A surface of a molded resin 4 is entirely or partially roughened, and the light is diffused by the roughened portion. Alternatively, a cap and a glass cap having a light-diffusive function are integrated together with a resin. Alternatively still, a resin section formed of a resin material in which another resin material having a different refractive index from that of the first resin material is mixed, or a resin formed of a birefringent resin material, is provided so as not to contact a laser chip, and the light is diffused by the resin section. Alternatively still, an area formed of a resin material in which another resin material having a different refractive index from that of the first resin material is mixed, or an area formed of a birefringent resin material, is provided so as not to contact the laser chip, and the light is diffused by the area.

83 Claims, 9 Drawing Sheets

(a)

(b)

(a)

(b)

P polarization ——
S polarization - - - -

(a)

(b)

500
SEMICONDUCTOR LASER DEVICE AND ITS MANUFACTURING METHOD, AND OPTICAL COMMUNICATION SYSTEM AND OPTICAL SENSOR SYSTEM

This application is the national phase under 35 U.S.C. §371 of PCT International Application No. PCT/JP00/02207 which has an International filing date of Apr. 5, 2000, which designated the United States of America.

TECHNICAL FIELD

The present invention relates to a semiconductor laser device widely used in optical communication systems and optical sensor systems, such as, for example, communication, medical and industrial sensors, and a method for producing the same. In particular, the present invention relates to a semiconductor laser device used for a light source, for emitting light into an outside space, which is directly viewed by humans: for example, a light source for wireless communication, a light source for a sensor or the like. The present invention also relates to a method for producing such a semiconductor laser device, and an optical communication system and an optical sensor system using such a semiconductor laser device to provide guaranteed safety.

BACKGROUND ART

As an example of a conventional space-emission semiconductor light emitting device, FIG. 10 shows a space-emission semiconductor light emitting device disclosed in Japanese Laid-Open Publication No. 8-264885.

This semiconductor light emitting device has a structure in which a laser chip 1 is soldered to a metal heat sink 6 and a tip area of the laser chip 1 and an electrode (lead frame) 3 are electrically connected to each other by a wire 3a. The heat sink 6 is integrated on a stem 8. The laser chip 1 is sealed by a cap 9 having a diffusive plate 5 bonded thereto.

In such a semiconductor light emitting device, light emitted from the laser chip 1 radiates toward the diffusive plate 5. The direction and phase of the light are disturbed by the diffusive plate 5, and thus the light is scattered. In this manner, the coherency of the radiating light is reduced so that safety for the eyes of a viewer is guaranteed, before the light is released to the outside space.

According to another known method for realizing a light-diffusive function, a laser chip is covered with a molded mixture of a silica-based resin and an epoxy-based resin. By this method, the laser light is scattered due to a difference in refractive index between the epoxy-based resin and the silica-based resin, thereby reducing the coherency of the radiating light. A material containing a small amount of silica-based resin mixed with an epoxy-based resin is generally used since the epoxy-based resin is light-transmissive and the silica-based resin is not light-transmissive.

In the case where a semiconductor device including the diffusive plate 5 shown in FIG. 10 is used, problems occurs such as, for example, the diffusive plate is broken when an apparatus having the semiconductor device mounted thereon is dropped or the like. As a result, a high output of coherent light can be undesirably released to the outside space.

In the case where the laser chip is covered with a molded resin containing a light-diffusive material, for example, a resin containing a silica-based resin, the following or other problems occur. Due to the high moisture permeability of the silica-based resin, wires are worn and broken or end surfaces of the laser chip are deteriorated over time. This reduces the reliability.

The present invention made to solve these problems of conventional devices has an objective of providing a semiconductor laser device for guaranteeing safety for the eyes by preventing a high output of coherent light from being released to the outside space so as to improve reliability, a method for producing the same, and an optical communication system and an optical sensor system using the same.

DISCLOSURE OF THE INVENTION

A semiconductor laser device according to the present invention includes a resin section in which a light-diffusive surface thereof is entirely or partially roughened, or a surface thereof facing a laser chip is entirely or partially roughened. The roughened portion of the resin section diffuses light so as to reduce coherency of the radiating light. Thus, the above-described objective is achieved.

A semiconductor laser device according to the present invention includes a resin section for integrating a container accommodating a laser chip and a sealing member having a light-diffusive function. The sealing member diffuses light so as to reduce coherency of the radiating light. Thus, the above-described objective is achieved.

A semiconductor laser device according to the present invention includes a resin section formed of a resin material in which a different resin material having a different refractive index from that of the first resin material is mixed or a resin section formed of a birefringent resin material, the resin section being provided so as not to contact a laser chip. The resin section diffuses light so as to reduce coherency of the radiating light. Thus, the above-described objective is achieved.

A semiconductor laser device according to the present invention includes a resin section, a portion of which is an area formed of a resin material in which a different resin material having a different refractive index from that of the first resin material is mixed or an area formed of a birefringent resin material, the area being provided so as not to contact a laser chip. The area diffuses light so as to reduce coherency of the radiating light. Thus, the above-described objective is achieved.

Preferably, an area at a center and the vicinity thereof of a surface of the resin section facing the laser chip is a curved surface having a light outgoing point of the laser chip as the center of curvature.

Preferably, a peripheral area of the surface of the resin section facing the laser chip is a curved surface having the center of curvature on a side opposite to the laser chip.

Preferably, an area at a center and in the vicinity of a surface of the resin section facing the laser chip is substantially flat and a peripheral area is convex.

Preferably, a normal to at least a light passing area of the convex area of the resin section is at an angle of larger than 0° and 3° or smaller with respect to a peak vector of a light beam emitted from the laser chip.

Preferably, an area at a center and in the vicinity of a surface of the resin section facing the laser chip is substantially flat and a peripheral area is roughened.

The resin section may be formed of a birefringent resin material.

A semiconductor laser device according to the present invention includes a resin section formed of a birefringent resin material and a laser chip integrated together, wherein the resin section diffuses light so as to reduce coherency of the radiating light. Thus, the above-described objective is achieved.

Preferably, a relationship of $\Delta n/n^2 > 0.0015$ is fulfilled, where $\Delta n$ is an inherent birefringence value of light having an oscillating wavelength of the semiconductor laser device and n is an average refractive index for a light having the oscillating wavelength.

The birefringent resin material may be one material, a polymer blend of at least two materials, or a polymer blend containing at least one material of polyimide, polycarbonate, polyallylate, polyethersulfone, polyphenylene sulfide, polyphenylene oxide, polyallyl sulfone, polyamideimide, polyolefin, polyacrylonitrile, cellulose and polyester.

The birefringent resin material may be an aromatic polyester.

The aromatic polyester may be polyallylate or polycarbonate.

The aromatic polyester may be polyallylate obtained from a divalent phenol compound represented by chemical formula (I) and an aromatic dicarboxylic acid or polycarbonate obtained from the phenol compound and phosgene:

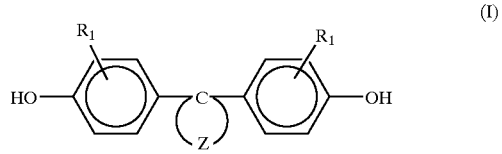

(I)

A method for producing a semiconductor laser device according to the present invention produces a semiconductor laser device including a resin section in which a light-diffusive surface thereof is entirely or partially roughened, or a surface thereof facing a laser chip is entirely or partially roughened. The method includes the steps of immersing a laser chip or a container accommodating a laser chip in a resin material; and curing the resin material and roughening a corresponding portion. Thus, the above-described objective is achieved.

A method for producing a semiconductor laser device produces a semiconductor laser device including a resin section in which a light-diffusive surface thereof is entirely or partially roughened, or a surface thereof facing a laser chip is entirely or partially roughened. The method includes the steps of immersing a laser chip or a container accommodating a laser chip in a resin material and curing the resin material: and roughening a corresponding portion of the cured resin material. Thus, the above-described objective is achieved.

The step of roughening the intended portion of the cured resin material may be performed by etching, polishing, or pressing a mold having a rough surface to the corresponding portion.

An optical communication system according to the present invention includes a semiconductor laser device according to the present invention. Thus, the above-described objective is achieved.

An optical sensor system according to the present invention includes a semiconductor laser device according to the present invention. Thus, the above-described objective is achieved.

Hereinafter, the function of the present invention will be described.

According to the present invention, as described later in Example 1, a light-diffusive surface of a resin section formed of a molded resin or the like is entirely or partially roughened. Alternatively, as described later in Example 8, a surface of a resin section for integrating a glass cap to a cap, the surface facing a laser chip, is entirely or partially roughened. The roughened portion of the resin section can diffuse light so as to reduce coherency of the radiating light. Therefore, there is no undesirable possibility that breakage of a diffusive plate may prevent safety for the eyes or that a reliability of the semiconductor laser device is lowered by a silica-based resin, unlike the conventional devices.

A desired portion of the resin section can be easily roughened by immersing the laser chip in a resin material using a mold having a rough surface and then curing the resin material. Alternatively, a desired portion of the resin section can be easily roughened by curing the resin material and then etching, by polishing, or by pressing a mold having a rough surface to a corresponding portion of the resin section.

As described later in Example 12, the resin section can be formed of a birefringent resin material and a surface of the resin section can be roughened. In this case, the light-diffusive function of the resin material itself and the light-diffusive function provided by the roughening of the surface are combined to diffuse light more efficiently. Thus, a semiconductor laser device which is highly stable can be provided.

In another embodiment of the invention, as described later in Example 2, a container such as a cap for accommodating the laser chip and a sealing member having a light-diffusive function (glass cap) such as a diffusive plate or the like are integrated together by a resin section. Since the sealing member having the diffusive function is integrated with the resin, there is no undesirable possibility that breakage of the diffusive plate may prevent safety for the eyes or that the reliability of the semiconductor laser device is lowered by a silica-based resin, unlike the conventional devices.

In still another embodiment of the invention, as described later in Examples 2 through 4 example, a resin section formed of a resin material in which another resin material having a different refractive index from that of the first resin material is therein is provided. Light is diffused by a difference in refractive index between different materials contained in the resin section so as to reduce coherency of the radiating light. Thus, there is no undesirable possibility that breakage of the diffusive plate may prevent safety for the eyes, unlike the conventional devices. Since the laser chip is not in contact with the resin section, stress-derived strain or the like due to a change in environmental temperature is not generated. Even when a moisture permeable material such as a silica-based resin or the like is included, the reliability of the semiconductor laser device is not reduced.

Alternatively, as described later in Examples 9 through 11, a resin section formed of a birefringent resin material is provided. As such, the refractive index is varied in accordance with the polarization state of the incident light. The light is diffused by the difference in refractive index, and thus coherency of the radiating light can be reduced. Therefore, there is no undesirable possibility that breakage of the diffusive plate may prevent safety for the eyes, unlike the conventional devices. There is no problem either that the reliability of the semiconductor laser device is reduced due to the use of a silica-based resin.

In the case where an area at the center and in the vicinity of a surface of the resin section, the surface facing the laser chip, is a curved surface having a light outgoing point of the laser chip as the center of curvature, the output efficiency of the S polarization can be increased as described later in Example 5.

In the case where an area at the center and in the vicinity of a surface of the resin section, the surface facing the laser chip, is formed to be a curved surface having a light outgoing point of the laser chip as the center of curvature, and a peripheral area is formed to be a curved surface having the center of curvature on the opposite side to the laser chip, the light output efficiency can be increased in accordance with the polarization state of the light as described later in Example 7.

In the case where an area at a center and in the vicinity of a surface of the resin section, the surface facing the laser chip, is formed to be substantially flat and a peripheral area is formed to be convex, light can be output from the diffusive plate more efficiently as described later in Example 6 or 2.

In the case where the normal to at least a light passing area of the convex area of the resin section is at an angle of larger than 0° and 3° or smaller with respect to a peak vector of a light beam emitted from the laser chip, the light output efficiency is further improved as described later in Example 6.

In the case where an area at a center and in the vicinity of a surface of the resin section, the surface facing the laser chip, is formed to be substantially flat and a peripheral area is roughened, the light output efficiency can be easily improved without detailed design as described later in Example 8.

In still another embodiment of the invention, a resin section includes an area formed of a resin material in which another resin material having a different refractive index from that of the first resin material is mixed as described later in Example 1. The light is scattered by the difference in refractive index between the materials contained in the area so as to reduce the amount of radiating light. As such, there is no undesirable possibility that breakage of the diffusive plate may prevent safety for the eyes, unlike the conventional devices. Since the area containing a material having a different refractive index is not in contact with the laser chip, stress-derived strain due to a change in environmental temperature is not generated. Even when a moisture permeable material such as a silica resin or the like is contained in the area, the reliability of the semiconductor laser device is not reduced.

Alternatively, as described later in Example 1, a resin section including an area formed of a birefringent resin material is provided. Since light is diffused by a refractive index which varies in accordance with the polarization state of the incident light, coherency of the radiating light can be reduced. There is no undesirable possibility that breakage of the diffusive plate may prevent safety for the eyes, unlike the conventional devices. There is no problem either that the reliability of the semiconductor laser device is reduced by a silica-based resin, unlike the conventional devices.

In still another embodiment of the invention, as described later in Example 10, a resin section formed of a birefringent resin material and a laser chip are integrated together. Since light is diffused by a refractive index which varies in accordance with the polarization state of the incident light, coherency of the radiating light can be reduced. There is no undesirable possibility that breakage of the diffusive plate may prevent safety for the eyes, unlike the conventional devices. Since the birefringent resin material is not moisture permeable, unlike a silica resin or the like, the laser chip can be directly immersed in the birefringent resin material without first curing another resin material.

As described later in Example 9, a birefringent resin material provides a sufficient light-diffusive function as long as the birefringent resin material fulfills the relationship of $\Delta n/n^2 > 0.0015$ where $\Delta n$ is an inherent birefringence value of a light having an oscillating wavelength of the semiconductor laser device and n is an average refractive index for a light having the wavelength.

Resin materials as the birefringent resin material includes polyimide, polycarbonate, polyallylate, polyethersulfone, polyphenylene sulfide, polyphenylene oxide, polyallyl sulfone, polyamideimide, polyolefin, polyacrylonitrile, cellulose and polyester. A polymer blend of at least two of these materials, or a polymer blend containing at least one of these materials may be used. As described in Examples 9 and 10, light can be diffused using the birefringence of these resin materials. In addition, the light output efficiency can be improved due to the high transparency thereof.

As the birefringent resin material, an aromatic polyester may be used as described in Examples 11 and 12. Aromatic polyesters usually have an inherent high level of birefringence. Most of the aromatic polyesters have a relatively high heat resistance and are colorless and highly transparent. Representative aromatic polyesters having a high level of birefringence and a superb transparency include polyallylate and polycarbonate. Especially, polyallylate obtained from a divalent phenol compound represented by chemical formula (I) and an aromatic dicarboxylic acid or polycarbonate obtained from a divalent phenol compound represented by chemical formula (I) and phosgene are preferable.

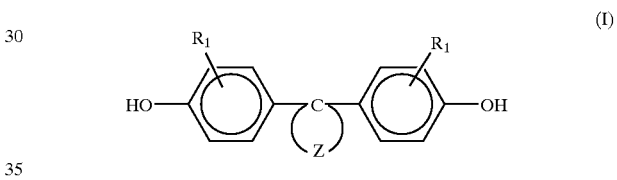

(I)

A representative aromatic polyester is, for example, a polyester using 9,9-bis(4-hydroxyphenyl)-fluorene represented by chemical formula (II) and disclosed in Japanese Laid-Open Publication No. 5-11115 as a divalent phenol compound.

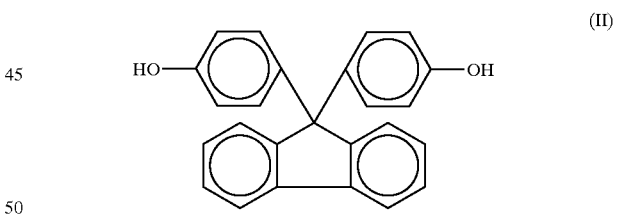

(II)

A three-dimensional (crosslinked) aromatic polyester can be used by adding a small amount of a trivalent phenol compound or aromatic tricarboxylic acid to the above aromatic polyester. Such a three-dimensional aromatic polyester improves the mechanical strength of the molded resin.

A semiconductor laser device according to the present invention guarantees safety for the eyes and has a satisfactory reliability. Such a semiconductor laser device can be preferably used for a laser beam which is directly viewed by humans in the fields of wireless optical communication, optical sensor systems and the like.

BRIEF DESCRIPTION OF THE DRAWINGS

FIG. 1(a) is a cross-sectional view of a semiconductor laser device according to Example 1, FIG. 1(b) is a perspective view of a mold used for producing the semiconductor laser device, FIGS. 1(a) and 1(d) are cross-sectional views of another semiconductor laser device according to Example 1.

BEST MODE FOR CARRYING OUT THE INVENTION

Hereinafter, the present invention will be described by way of examples with reference to the drawings.

EXAMPLE 1

Figure 1:
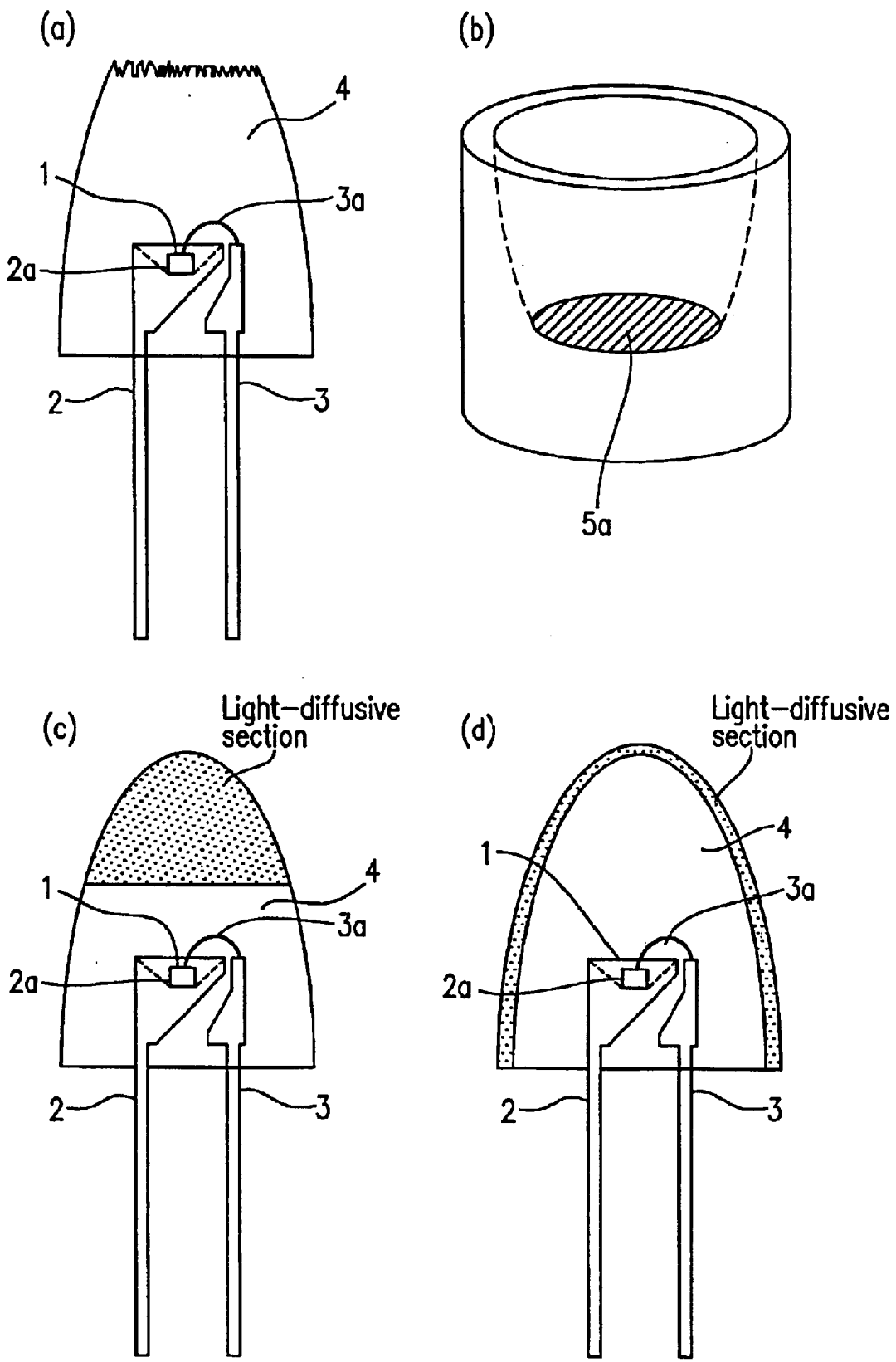

FIG. 1(a) is a cross-sectional view illustrating a semiconductor laser device according to Example 1.

This semiconductor laser device has the following structure. A laser chip 1 is die-bonded to a recess 2a in a top portion of a lead frame 2. An upper electrode of the laser chip 1 and another lead frame 3 are electrically connected to each other by a wire 3a. The laser chip 1 is covered with a molded resin, and a top surface of the resin section 4 is roughened.

The semiconductor laser device can be produced in, for example, the following manner.

Like a method for producing a typical molded light emitting diode, the laser chip 1 is die-bonded to the recess 2a in the top portion of the lead frame 2 with a silver paste or the like. An upper electrode of the laser chip 1 and another lead frame 3 are electrically connected to each other by a wire bonding step.

Then, the chip is immersed in a molding resin which fills a mold. The resin is heated so as to be cured. In Example 1, an epoxy-based resin, which allows light having an oscillating wavelength of the semiconductor laser device to be transmitted therethrough, is used as the resin. In order to provide the resin with a function of diffusing the light when the resin is cured, a mold having a roughened bottom surface 5a as shown in FIG. 1(b) is used as the mold. In this case, various types of resin sections can be formed merely by changing the design of the mold without requiring any extra processing steps.

An area to be roughened varies depending on the expansion of the light emitted by the laser chip itself, but it is generally sufficient to roughen only the tip area. It is possible to roughen a side surface when necessary.

In the semiconductor laser device in Example 1 obtained in this manner, the roughened area of the resin section 4 has a light-diffusive function and is integrated with the laser chip. Therefore, the inconvenience of the diffusive plate being broken or the like does not occur, unlike the case of using the conventional diffusive plate. Thus, the strength of the device can be improved. Even when the resin section is destroyed for some reason, the wire 3a connecting the laser chip 1 and the lead frame 3 is broken and thus laser oscillation is stopped. Therefore, safety for the eyes can be guaranteed. In addition, only the transparent resin contacts the laser chip 1. A material having high moisture permeability such as a silica-based resin or the like is not used, unlike the conventional devices. Therefore, an amount of moisture absorbed is small, and thus device deterioration is not caused by the moisture.

In Example 1, a rough surface similar to the above-mentioned roughened area can be provided by curing the resin using a mold having a smooth surface, and then melting the tip area of the resin section with a solvent, polishing the tip area with particles having an appropriate roughness number or a paper file having an appropriate roughness, or pressing a mold having a rough surface to the tip portion of the resin section. In this case, a mounting process of a conventional light emitting diode can be utilized with a simple step being added after the resin is cured.

Alternatively, the following method is also usable. A resin material containing another resin material having a different refractive index from that of the first resin material as a diffusive material mixed therein, for example, a resin containing a silica-based resin mixed with an epoxy-based resin, is placed into a mold having a smooth surface. The resin is first cured. Then, a transparent resin such as an epoxy resin or the like is placed into the mold. A laser chip Is immersed in the resin, and the resin is cured. Thus, a light-diffusive section shown in FIG. 1(a) is formed. Alternatively, a light-diffusive section shown in FIG. 1(d) may be formed by covering the resin section 4, of a semiconductor laser device, which is formed by molding a transparent resin with a diffusive resin and then curing the resin. In this case, the area formed of a resin material in which another resin material having a different refractive index from that of the first resin material is mixed can scatter the light by the difference in refractive index. Therefore, such an area can act as a diffusive area having a diffusive function equivalent to that of the roughened surface. Alternatively still, a light-diffusive section can be formed using a birefringent material as shown in each of Examples 9 through 12 described later, instead of a resin material containing another resin material having a different refractive index from that of the first resin material mixed therein. In this case, an area formed of a birefringent material provides a refractive index which varies in accordance with a polarizing state of the incident light, and thus can scatter the light. A semiconductor laser device obtained by any of these methods is encompassed by claim 4.

EXAMPLE 2

Figure 2:
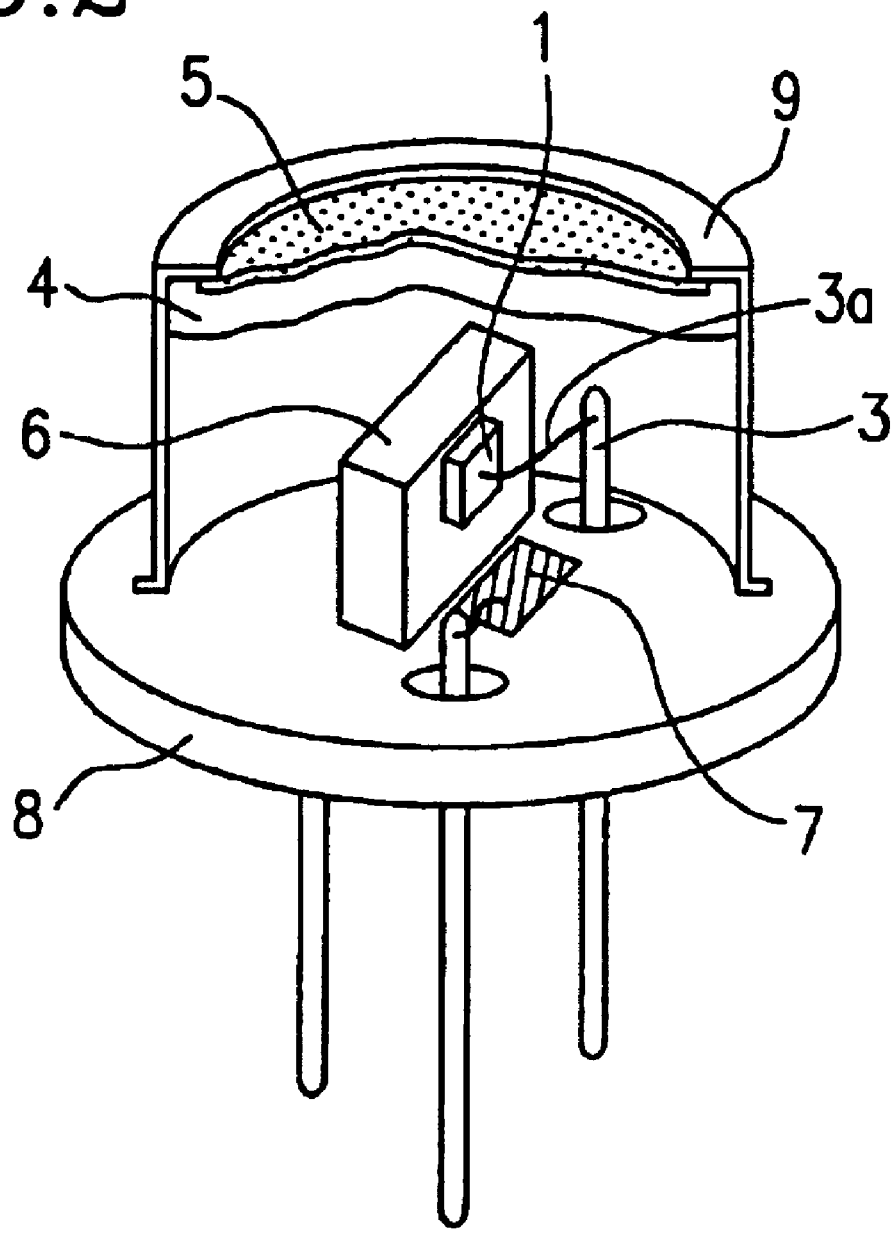
FIG. 2 is a perspective view of a semiconductor laser device according to Example 2.

FIG. 2 is a perspective view of a semiconductor laser device according to Example 2.

The semiconductor laser device has the following structure. Like a typical semiconductor laser device package, a laser chip 1 is mounted on a heat sink 6, and a top surface of the laser chip 1 and a lead frame 3 are electrically connected to each other by a wire 3a. The heat sink 6 is integrated with a stem 8 having a light receiving element 7 therein. The laser chip 1 is sealed by a cap 9 provided with a glass cap (diffusive plate) 5 having a light-diffusive function bonded thereto. The diffusive plate 5 is integrated with the cap 9 by a resin section 4.

In Example 2, the cap can be formed in the following exemplary manner.

A resin is dropped to an inner surface of the cap 9 having the diffusive plate 5 bonded thereto, and the resin is cured by heating. The resin material is dropped in an amount which prevents the resin section 4 from contacting the laser chip 1 when the laser chip 1 is sealed with the cap 9. The amount of the resin material need not be precisely controlled. As the resin material, a transparent resin material such as, for example, an epoxy resin is usable. As the diffusive plate 5, a conventional diffusive plate is usable. The cap 9 formed in this manner is welded to the stem 8 by electrical heating.

In the semiconductor laser device according to Example 2 obtained in this manner, the resin section 4 is provided so as to cover the diffusive plate 5 inside the cap 9. Therefore, the diffusive plate 5 is not broken when an apparatus having the semiconductor device mounted thereon is dropped so long as the apparatus is only dropped to a typical extent unlike the conventional devices. Thus, safety for the eyes can be guaranteed.

In the semiconductor laser device described in Example 1, the laser chip 1 is heated during laser oscillation to a temperature which is higher than the environmental temperature by several to several tens of degrees. At this point, a stress-derived strain is generated at an interface between the resin section 4 and the laser chip 1 due to a difference between the coefficient of thermal expansion. Under certain conditions of use, the laser chip 1 is deteriorated. By contrast, in the semiconductor laser device described in Example 2, the resin section 4 and the laser chip 1 do not contact each other. Therefore, no stress-derived strain is generated due to a difference in temperature between the laser chip 1 and the resin section 4. Thus, the reliability can be further improved.

In Example 2, a typical glass cap with no light-diffusive function may be used instead of the diffusive plate 5, and a light-diffusive resin (for example, a resin material containing another resin material having a different refractive index from that of the first resin material as a diffusive material mixed therein, or a birefringent resin material) may be dropped into the cap 9 and cured. In this case, a substantially similar effect as described above can be provided. In this case, a structure of preventing the resin section and the laser chip from contacting each other does not reduce the reliability even when a resin containing a silica-based resin mixed with an epoxy-based resin is used. A semiconductor laser device obtained by this method is encompassed by claim 3.

EXAMPLE 3

Figure 3:
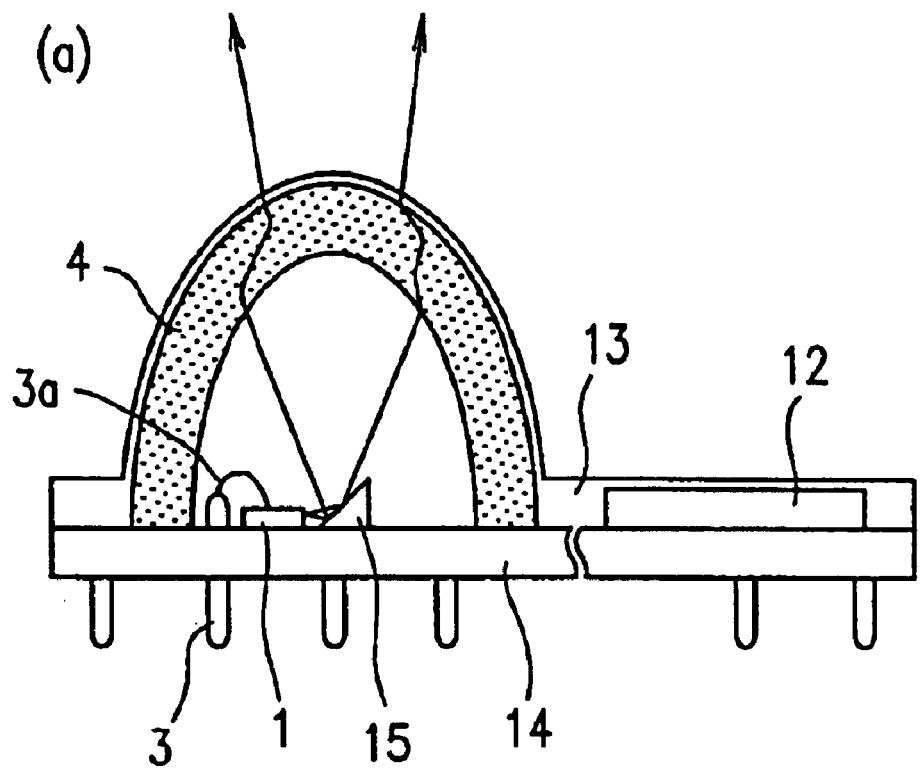
FIG. 3(a) is a cross-sectional view of a semiconductor laser device according to Example 3.
FIG. 3(b) is a perspective view of a mold used for producing the semiconductor laser device.
Figure 3:
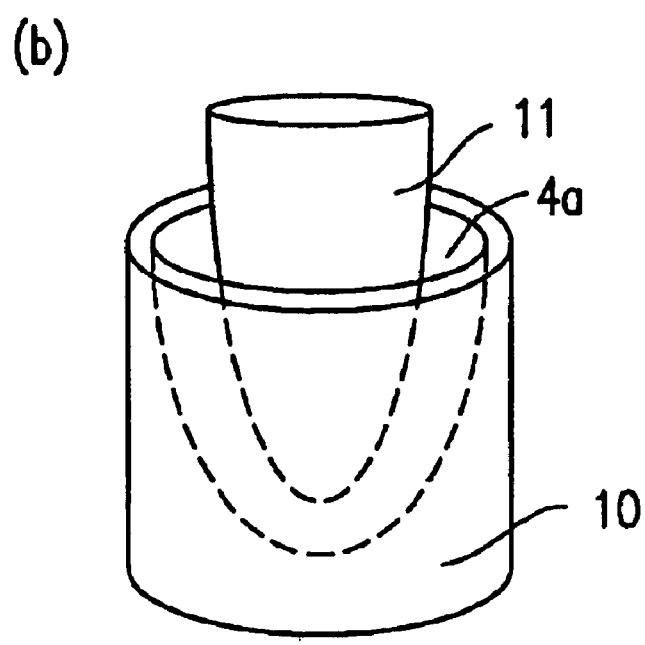

FIG. 3(*a*) is a perspective view of a semiconductor laser device according to Example 3.

The semiconductor laser device has the following structure. A laser chip 1 is mounted on an IC substrate 14. A top surface of the laser chip 1 and a lead frame 3 are electrically connected to each other by a wire 3*a*. One surface of the laser chip 1 has a high reflectance, and light only goes out through the one surface. A 45° mirror 15 is provided on an optical path of the light going out from the laser chip 1, so that the light is incident on a top surface of the mirror 15. A lens (resin section) 4 formed of a resin is provided so as to cover the 45° mirror 15. On the IC substrate 14, an IC chip 12 is mounted.

In Example 3, the lens 4 formed of a resin can be formed using, for example, molds 10 and 11 shown in FIG. 3(*b*). As the resin material 4*a*, a resin material containing another resin material having a different refractive index from that of the first resin material mixed therein, for example, a resin containing an silica-based resin mixed with an epoxy-based resin is usable in order to provide laser light which is safe for the eyes. After the IC chip 12 including a driving circuit and the like integrated therein is mounted, the lens 4 may be fixed by covering the lens 4 with a resin 13. As the resin 13, a resin having low moisture permeability is preferable. Instead of the resin material containing another resin material having a different refractive index from that of the first resin material mixed therein, a birefringent resin material as shown in each of Examples 9 through 12 described later is also usable.

In the semiconductor laser device according to Example 3 obtained in this manner, the light emitted from the laser chip 1 is diffused by the resin section 4 and has a radiation angle pattern controlled by the lens effect of the resin section 4. Therefore, light can radiate to the outside space over a larger range of angles. Safety of eyes is defined by the optical power or optical power density of light incident on the pupil. Thus, it is very effective to be able to control the radiation angle distribution by the lens effect. Since the resin section 4 and the laser chip 1 do not contact each other, no stress-derived strain is generated due to a difference in temperature between the laser chip 1 and the resin section 4. Thus, the reliability can be improved. Even when a material having moisture permeability such as a silica-based resin or the like is used, the reliability is not reduced. When the 45° mirror 15 has a rough surface and thus has a diffusive function, safety for the eyes can be further improved, and transparency of the lens can be improved by reducing the amount of the diffusive material mixed in the resin section 4.

EXAMPLE 4

Figure 4:
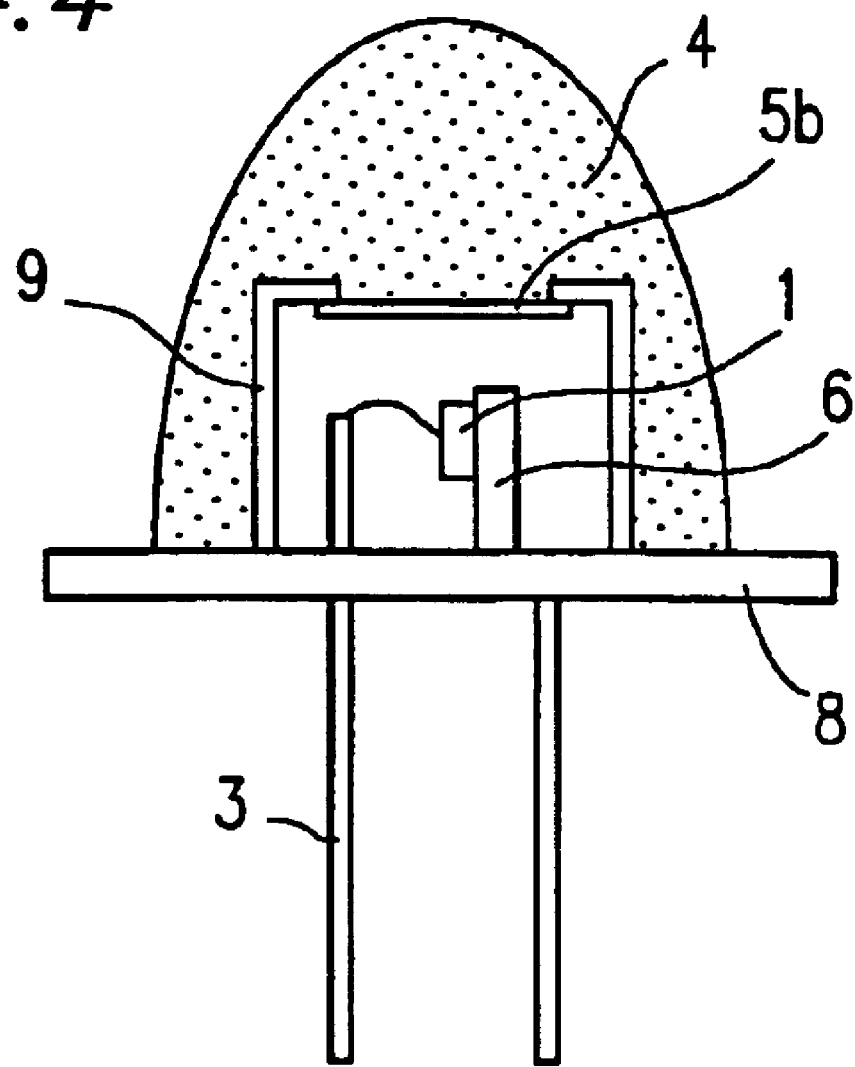
FIG. 4 is a cross-sectional view of a semiconductor laser device according to Example 4.

FIG. 4 is a cross-sectional view of a semiconductor laser device according to Example 4.

The semiconductor laser device is obtained by covering a conventionally known semiconductor laser device with a molded resin so that the semiconductor laser device has a light-diffusive function. A laser chip 1 is sealed in a can-type package. A lens (resin section) 4 formed of a resin is provided so as to cover a cap 9 and a glass cap 5*b* (a typical glass cap which does not have a light-diffusive function).

In Example 4, the lens 4 formed of a resin can be formed using, for example, a mold 10 shown in FIG. 3(*b*). As the resin material, a resin material containing another resin material having a different refractive index from that of the first resin material mixed therein, for example, a resin containing an epoxy-based resin mixed in an epoxy-based resin is usable in order to provide laser light which is safe for the eyes. Instead of the resin material containing another resin material having a different refractive index from that of the first resin material mixed therein, a birefringent resin material as shown in each of Examples 9 through 12 described later is also usable.

A compact semiconductor laser package providing guaranteed safety for the eyes is obtained by a combination of a typical semiconductor laser device production process and a molding step.

In the semiconductor laser device according to Example 4 obtained in this manner, the light emitted from the laser chip 1 is diffused by the resin section 4 and has a radiation angle pattern easily controlled by the lens effect of the resin section 4. Such a semiconductor laser device can be easily connected to an optical fiber or the like. Since the resin section 4 and the laser chip 1 do not contact each other, no stress-derived strain is generated due to a difference in temperature between the laser chip 1 and the resin section 4. Thus, the reliability can be improved. Even when a material having moisture permeability such as a silica-based resin or the like is used, the reliability is not reduced.

EXAMPLE 5

Figure 5:
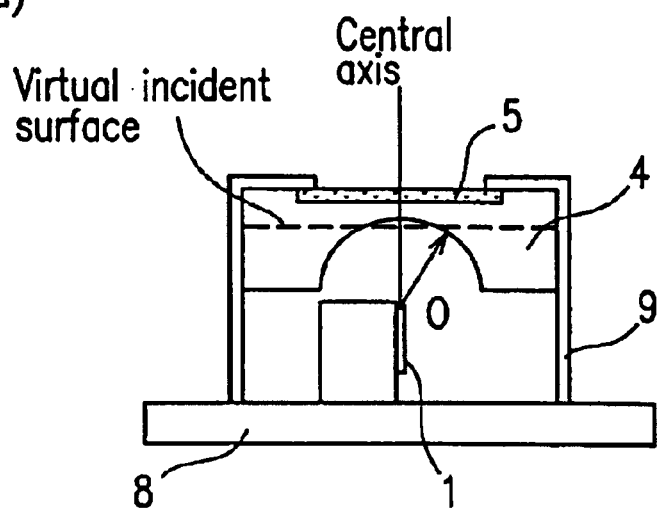
FIG. 5(a) is a cross-sectional view of a semiconductor laser device according to a firth example.
FIG. 5(b) is a graph illustrating the relationship between the reflectance of a light beam at a resin section and the incident angle of an S polarization and a P polarization.
Figure 5:
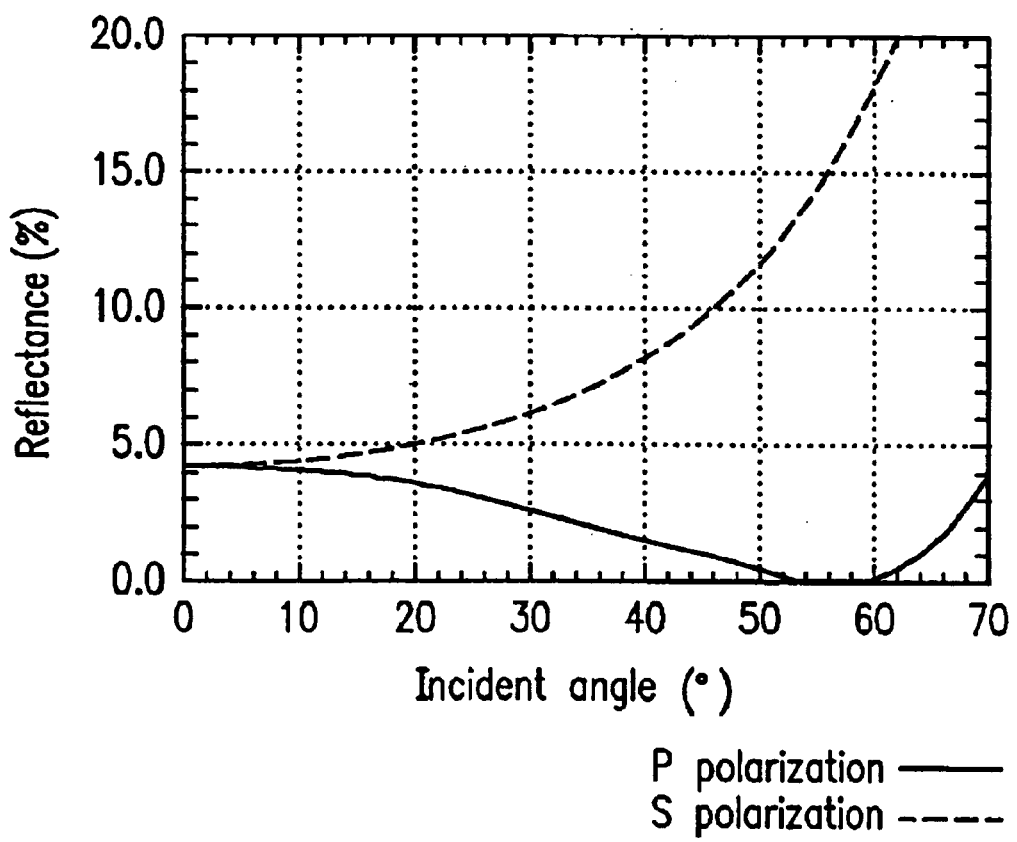

FIG. 5 is a cross-sectional view of a semiconductor laser device according to Example 5.

The semiconductor laser device is obtained by changing a planar shape of the resin section 4 of the semiconductor laser device in Example 2. In FIG. 5 and FIGS. 6 through 8 referred to later, the lead frame and the wire are omitted.

Specifically, an area at the center and in the vicinity thereof of a surface of the resin section 4, the surface facing the laser chip 1, is formed to be a curved surface having a light outgoing point O of the laser chip 1 as the center of curvature. An area which is not substantially irradiated with light can have an arbitrary shape.

In the following description, a virtual incident surface corresponding to the surface of the resin section in Example 2 is used for simplicity.

In this semiconductor laser device, the light emitted from the laser chip 1 has an electric field along an outgoing surface. Therefore, the light emitted from the laser chip 1 substantially along the central axis is considered to be incident on the virtual incident surface as a substantially S polarization (having an electric field parallel to the incident surface).

FIG. 5(b) illustrates the relationship between the reflectance of the light beam at the resin section 4 and the incident angle of an S polarization and a P polarization (having an electric field vertical to the incident surface). It is appreciated from this figure that the reflectance of the S polarization is lowest when incident vertically.

Accordingly, it is effective to use the light emitting point O of the laser chip 1 as the center of curvature of the resin section 4, especially when a laser chip having a small angle of beam expansion is used. The reason is because the reflectance of the S polarization incident on the resin section 4 is reduced in this manner and thus the light output efficiency can be improved. In this example, the light output efficiency can be improved by about 1% to 2%.

In Example 5, the planar shape of the resin section of the semiconductor laser device in Example 2 is changed. It is also possible to change the planar shape of the semiconductor laser device in Example 3. In either case, the design of the shape of the inner wall the resin section 4 is changed.

EXAMPLE 6

Figure 6:
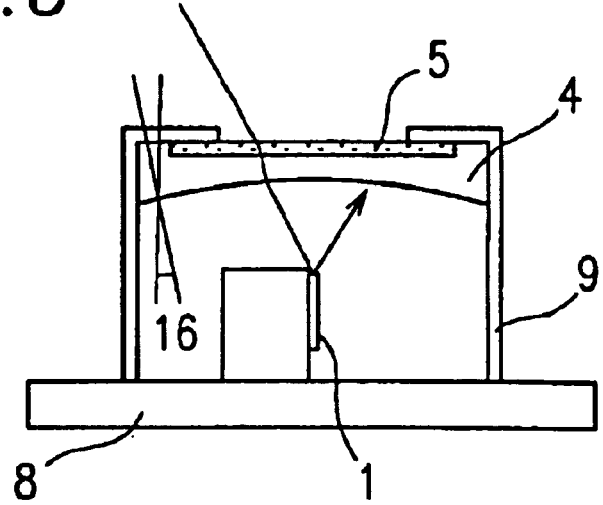
FIG. 6 is a cross-sectional view of a semiconductor laser device according to Example 6.

FIG. 6 is a cross-sectional view of a semiconductor laser device according to Example 6.

This semiconductor laser device is obtained by further changing a planar shape of the resin section 4 of the semiconductor laser device in Example 5.

Specifically, an area at the center and in the vicinity thereof of a surface of the resin section 4, the surface facing the laser chip 1, is formed to be flat and the peripheral areas are formed to be convex.

The reasons for this are as follows. In Example 5, all the light beams incident on the resin section 4 are incident vertically. The direction of the light beams do not change in the resin section 4. In such a state, the light is reflected by an interface between the diffusive plate 5 and the air. Thus, the light output efficiency is not increased beyond a certain level. As a result of investigation of several resin shapes, the present inventors have confirmed that the resin shape shown in FIG. 6 improves the light output efficiency by a highest degree when the top surface of the diffusive plate 5 is flat. In Example 2 in which a light-diffusive resin is integrated with a typical glass cap, the light output surface (top surface of the glass cap) is flat. Therefore, the light output efficiency is improved by changing the shape of the resin surface facing the laser chip as described in this example.

As described above, when a laser chip having a beam expansion angle of 10 to 30 degrees is used, the light incident on the interface between the resin section and the laser chip can be regarded as substantially S polarization. In this example, an area at the center and in the vicinity thereof of the surface of the resin section 4 facing the laser chip 1 is made substantially flat and the peripheral areas are made convex. Thus, the reduction in transmittance at the interface between the resin section 4 and the air is compensated for by the improvement in transmittance at the interface between the diffusive plate 5 and the air. In this manner, the entire transmittance can be improved. In this example, the light output efficiency can be improved by about 3%.

In this example, the angle 16 between the normal to the peripheral areas (convex areas) of the resin section 4 and the peak light beam vector of the light emitted by the oscillation of the laser chip 1 (inclined angle) is preferably 3 degrees or smaller. It has been confirmed that the light output efficiency is improved when the inclined angle is in the range of 0 degrees<inclined angle 16≦3 degrees.

In Example 6, an area of the resin section 4 which is not irradiated with laser light can have an arbitrary shape. Only the area irradiated with the laser light can be specifically designed.

EXAMPLE 7

Figure 7:
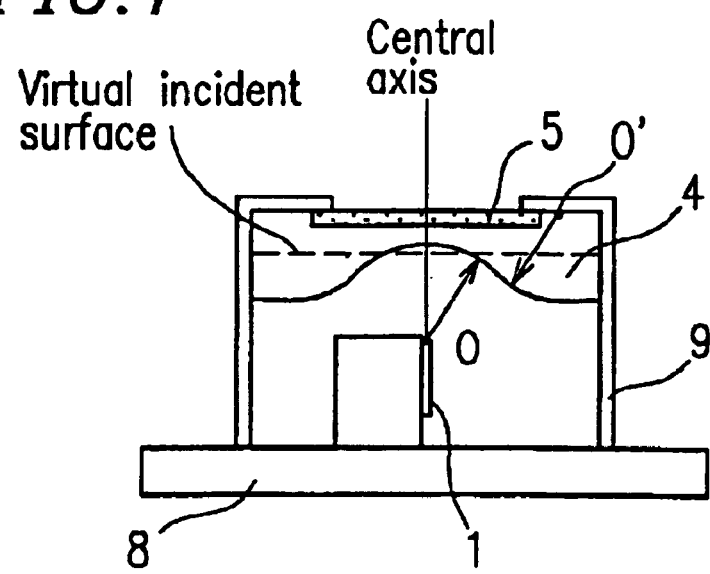
FIG. 7 is a cross-sectional view of a semiconductor laser device according to Example 7.

FIG. 7 is a cross-sectional view of a semiconductor laser device according to Example 7.

The semiconductor laser device is obtained by further changing a planar shape of the resin section 4 of the semiconductor laser device in Example 5.

Specifically, an area at the center and in the vicinity thereof of a surface of the resin section 4, the surface facing the laser chip 1, is formed to be a curved surface having a light outgoing point O of the laser chip 1 as the center of curvature, and peripheral areas are formed to be a curved surface O' having the center of curvature on the opposite side to the laser chip.

As shown in FIG. 5(b), the reflectance of a P polarization is lower than that of an S polarization. Thus, the entire reflectance can be reduced by effectively using the P polarization.

As described in Example 5, a light beam at the central axis and in the vicinity thereof can be regarded as a substantially S polarization with respect to the virtual incident surface. By contrast, a light beam deviating from the central axis by about 45 degrees includes an S polarization and a P polarization mixed at a ratio of 1:1. As the angle increases, the ratio of the P polarization increases.

Therefore, in an area of the resin section 4 in the range from a position on the central axis to positions at which the light beams which deviate from the central axis by about 45 degrees pass, the light outgoing point O is used as the center of curvature, in order to lower the reflectance of the S polarization. The peripheral areas of the resin section outside the positions at which the light beams deviating from the central axis by about 45 degrees pass are made to be curved surfaces O' having the center of curvature on the opposite side to the laser chip in order to reduce the reflectance of the P polarization. Due to such a structure, the light reflectance at the interface between the resin section 4 and the laser chip can be reduced in accordance with the polarization state so as to improve the light output efficiency. In this example, the light output efficiency can be improved by 2% using a laser chip having a beam expansion angle of 30 degrees in both horizontal and vertical directions.

EXAMPLE 8

Figure 8:
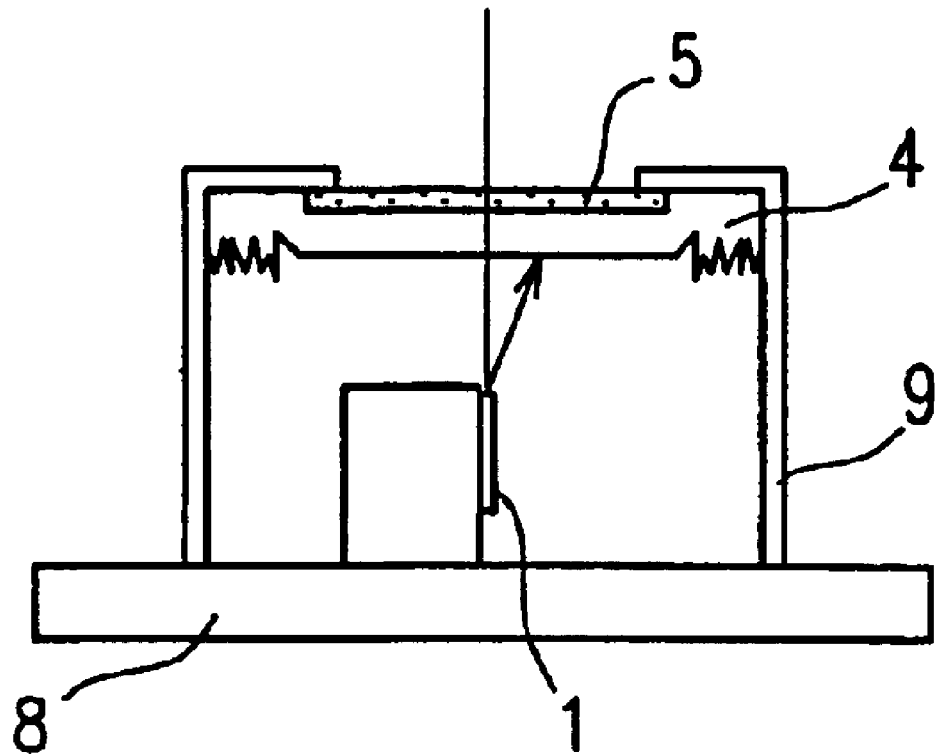
FIG. 8 is a cross-sectional view of a semiconductor laser device according to Example 8.

FIG. 8 is a cross-sectional view of a semiconductor laser device according to Example 8.

The semiconductor laser device is obtained by changing a planar shape of the resin section 4 of the semiconductor laser device in Example 2.

As described in Examples 5 through 7, the light incident in a central area and the vicinity thereof is a substantially S polarization. The transmittance of the S polarization is maximum when the light is incident vertically. In areas far from the central area, the ratio of the P polarization increases, and the transmittance of the P polarization is maximum when the light is incident at about 57 degrees.

In order to address such an inconvenience, as shown in FIG. 8, an area at the center and in the vicinity thereof of a surface of the resin section 4, the surface facing the laser chip 1, is formed to be substantially flat, and only the peripheral areas of the resin section 4 outside the positions at which the light beams deviating from the central axis by about 45 degrees pass are roughened. In this manner, the P polarization output efficiency can be improved most easily without requiring detailed designs, and thus the light output efficiency can be improved.

In Example 2, it is described that a typical glass cap with no light-diffusive function may be used instead of the diffusive plate 5 and a light-diffusive resin may be dropped into the cap 9 and cured. With such a structure, the device is heated and the light output efficiency is reduced since the light-diffusive material usually has a light absorption ratio of as high as about 20%.

In order to address such an inconvenience, a typical transparent resin is used instead of using the light-diffusive resin. The roughening of the resin section 4 described in this example is performed on the entirety of the surface of the resin section, the surface facing the laser chip 1. Thus, the light is diffused by the roughened surface, and so a semiconductor laser device which does not require the diffusive plate 5 is obtained. In this case, in the area at the center and in the vicinity thereof, light is reflected and thus the transmittance is reduced, but the influence of the reduction can be decreased to about 10%. A semiconductor laser device obtained by this method is encompassed by claim 1.

EXAMPLE 9

Figure 9:
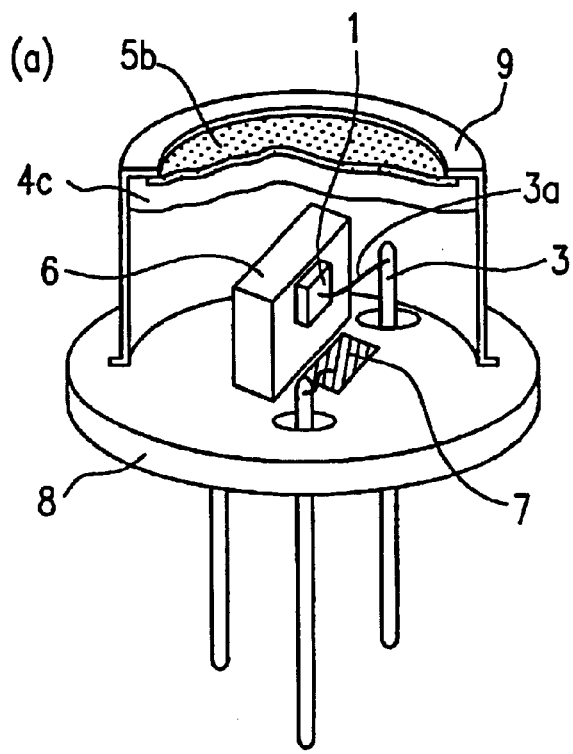
FIG. 9(a) is a cross-sectional view of a semiconductor laser device according to Example 9.
FIG. 9(b) is a perspective view illustrating light diffusion thereof.
Figure 9:
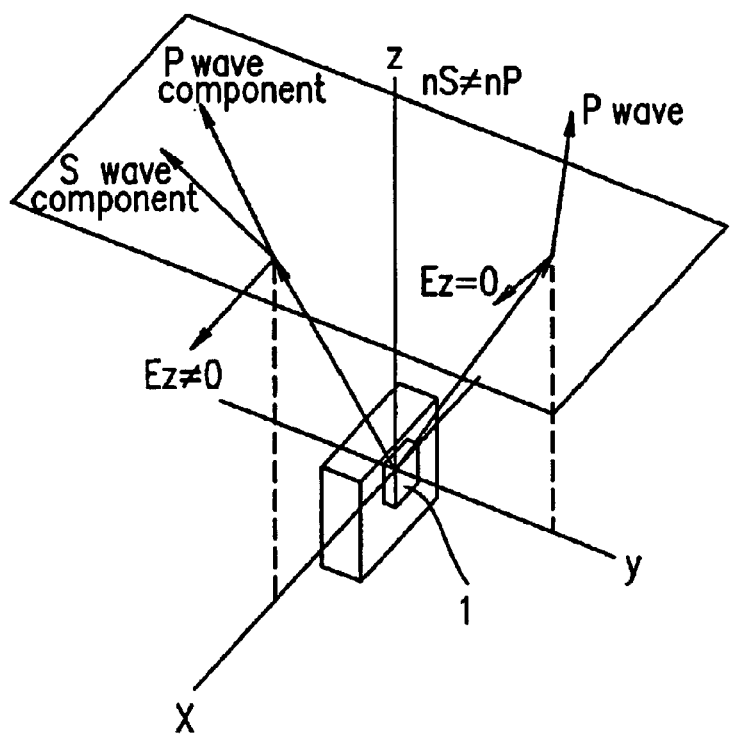
Figure 10:
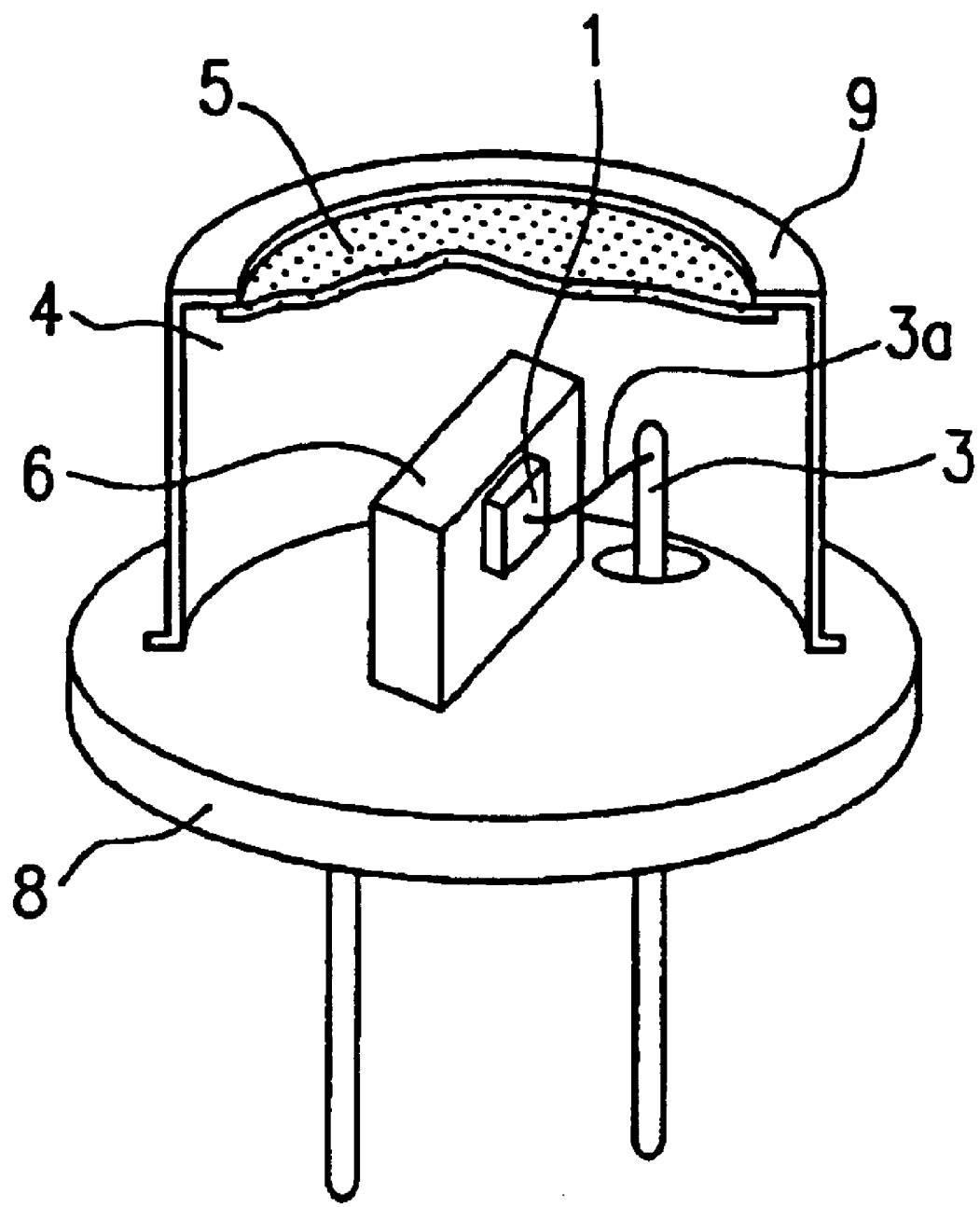
FIG. 10 is a perspective view of a conventional semiconductor laser device.

FIG. 9(a) is a perspective view of a semiconductor laser device according to Example 9.

This semiconductor laser device realizes a light-diffusive function using a birefringent resin material.

This semiconductor laser device has the following structure. Like a typical semiconductor laser device package, a laser chip 1 is mounted on a heat sink 6, and a top surface of the laser chip 1 and a lead frame 3 are electrically connected to each other by a wire 3a. The heat sink 6 is integrated with a stem 8 having a light receiving element 7 therein. The laser chip 1 is sealed by the cap 9 having a glass cap 5b (having no light-diffusive function) bonded thereto. The glass cap 5b is integrated with the cap 9 by use of a resin section 4c formed of a birefringent resin material.

In the semiconductor laser device, the light emitted by the laser chip 1 is diffused by the birefringent resin section 4a formed on the glass cap 5b with no light-diffusive function.

The semiconductor laser device according to Example 9 can be produced in, for example, the following manner.

As the birefringent resin material, polyimide fluoride (or simple polyimide) having a high degree of transparency is used. As described in Journal of Applied Physics (January, 1999), page 8, this material can be synthesized by polymerizing 2,2'-bis-4,4'-diaminobiphenyl (TFDB) and 4,4'-diaminodiphenylether (ODA) with 2,2'-bishexafluoropropane dianhydride (FDA) and heating the polyrimerization product. When, for example, a polyimide fluoride is synthesized by polymerization on the glass cap 5b, the produced copolymer molecules are aligned along the plane of the glass cap 5b. Therefore, the refractive index of the light incident on the glass cap 5b varies in accordance with the polarization state of the incident light. Thus, the light can be diffused. The difference in refractive index at this point is about 0.008, which is sufficient to diffuse light. The glass caps with the resin 4a, 5b is attached to the cap 9, and the cap 9 with the glass caps with the resin 4c, 5b is located so as to cover the laser chip 1.

Hereinafter, light diffusion of the semiconductor laser device in this example will be described. In FIG. 9(b), the origin of the coordinate system is the light outgoing point of the laser chip 1. A z direction is a direction of the optical axis, and an x direction is parallel to the laser chip 1. Typical laser light has an electric field E in a direction parallel to an active layer of the laser chip (the direction parallel to the laser chip although the active layer is not shown). Therefore, when light is incident on the resin section 4c having a plane vertical to the z axis, all light beams in which the x component of the direction vector is not 0 have an electric field component vertical to the interface between the resin and the laser chip and an electric field component horizontal to the interface. These light beams have different refractive indices in the resin section 4a, and thus the light is diffused. In FIG. 9(b), a P wave is a component, the electric field of which is parallel to the interface. An S wave is a component, the electric field of which is vertical to the interface.

As a result of experiments and computer simulations, the present inventors have confirmed that a sufficient level of light-diffusive function is provided when $\Delta n/n^2 > 0.0015$, where "n" is the average refractive index and is obtained by n=(nS+nP)/2. In these expressions, "nS" is the refractive index of the S wave when the laser light is vertically incident on the resin section 4a, and "nP" is the refractive index of the P wave when the laser light is vertically incident on the resin section 4a. $\Delta n$ is the difference between the refractive index of the S wave and the refractive index of the P wave (inherent birefringence value), and is obtained by $\Delta n = |nS - nP|$. In the case of, for example, polyimide fluoride, n=about 1.6 to 1.5 and $\Delta n$=about 0.008 when the content of 6FDA–TFDB is in the range of 0% to 100%. This fulfills the above-mentioned conditions.

In the semiconductor laser device according to Example 9 obtained in this manner, the light transmittance of the birefringent resin material is satisfactory, and thus light diffusion can be realized with a high light output efficiency. Accordingly, unlike the device including a moisture permeable material such as a silica-based resin or the like, reduction in the light transmittance and in the light output efficiency is avoided.

The resin section 4c formed of a birefringent resin material need not be formed to be a plate having two main surfaces parallel to each other as in this example. For example, the resin section 4c may have a shape of the light-diffusive resin section 4 described in Example 3 or 4. When, for example, the resin section 4 is formed of polyimide fluoride, the molecules are aligned on the glass cap 5b along the plane thereof. As the molecules become farther from the glass plane, the regularity of the alignment is reduced and finally birefringence is not present. As described above, the molecules are regularly aligned in a portion of the resin section, and light is diffused by such a portion. When the resin section 4 in Example 4 is formed of a birefringent resin material, substantially the entirety of the resin section has birefringence. The reason is because the resin section is relatively thin, and so the molecules are aligned in the resin section.

EXAMPLE 10

In this example, a laser chip which is covered with a molded birefringent resin material produced by immersing the laser chip directly in the birefringent resin material will be described.

In Example 1, a plurality of molding steps as shown in, for example, FIGS. 1(c) and 1(d) are performed in order to make the resin partially light-diffusive. Unlike a silica-based resin material, a birefringent resin material represented by polyimide has low moisture permeability, and thus the laser chip can be directly immersed in the birefringent resin material without first curing another resin material.

Usable resin materials other than polyimide include polycarbonate, polyallylate, polyethersulfone, polyphenylene sulfide, polyphenylene oxide, polyallyl sulfone, polyamideimide, polyolefin, polyacrylonitrile, cellulose and polyester. A polymer blend of at least two of these materials, or a polymer blend containing at least one of these materials may be used. Especially, a material fulfilling the relationship of $\Delta n/n^2 > 0.0015$ is more effective, where $\Delta n$ is the inherent birefringence value of the light having the oscillating wavelength of the semiconductor laser device and n is the average refractive index for the light having the wavelength.

In the case of, for example, polycarbonate, a resin section can be formed by heating and thus melting a polycarbonate pellet obtained by condensation of phosgene and bisphenol A, pouring the thus melted pellet into a mold, and then cooling the melted pellet to room temperature. The light-diffusive function may be realized by a birefringent resin material.

EXAMPLE 11

In this example, formation of a resin section 4 of a semiconductor laser device shown in FIG. 4 using a birefringent resin material will be described.

A polyallylate resin material and a polycarbonate resin material represented by the following formulas were molded using the mold 10 shown in FIG. 3.

Polyallylate resin material

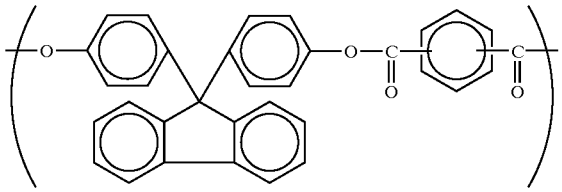

Polycarbonate resin material

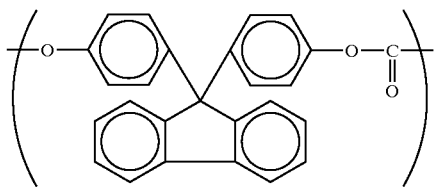

Using such an aromatic polyester resin material, a compact semiconductor laser package which can guarantee safety for the eyes can be obtained by a typical semiconductor laser device production process and molding step.

In the semiconductor laser device obtained in this manner, a light-diffusive function can be realized due to a high level of birefringence of the resin itself. Thus, a semiconductor laser device which is safe to the eyes can be produced without requiring complicated processing or the like. In addition, these resin materials are both superior in heat resistance with a Tg of 160° C. or higher. These resin materials are also superior in moisture resistance.

EXAMPLE 12

A semiconductor laser device was produced in a similar manner to that of Example 1 except that the polyallylate resin material described in Example 11 was used instead of the epoxy-based resin material described in Example 1. In this example, no additional processing for curing was performed.

The semiconductor laser device obtained in this manner has a light-diffusive function and guarantees safety for the eyes. In addition, the semiconductor laser device does not have characteristics thereof deteriorated and is superior in heat resistance.

EXAMPLE 13

In this example, an optical communication system and an optical sensor system will be described.

A semiconductor laser device according to the present invention has guaranteed safety for the eyes, and thus is suitable to be used for a light source which is directly viewed by humans, such as a light source of a wireless optical communication system, an optical sensor system or the like.

The upper limit of the laser radiation power defined by IEC60825-1, which is an international safety standard, is determined by, for example, the size and the radiation angle of the light source. In the case where, for example, the half intensity angle is 15 degrees in the Lambertian distribution, which is a general radiation angle pattern, an optical output of up to about 160 mW can be provided when the light source has a size of 10 mm and emits light having a wavelength of 780 nm.

In order to release laser light of such a high optical output to the outside space, it is necessary to use a semiconductor laser device described in each of Examples 1 through 12, which guarantees safety for the eyes and does not have the light-diffusive function reduced even by an external impact or the like. As described above, use of such a semiconductor laser device provides safety and also long-term reliability. Such a semiconductor laser device is applicable to a wide range of fields including wireless communication, medicine and industrial sensors.

Industrial Applicability

As described in detail above, according to the present invention, a surface of a resin molded to cover a laser chip, a surface of a resin for integrating a glass cap to a cap, or the like is roughened to provide the resin section with a light-diffusive function. Thus, there is no possibility of the undesirable characteristics of the conventional devices, such as breakage of the diffusive plate occurring, and therefore safety for the eyes is guaranteed. Since a diffusive material such as a silica-based resin or the like is not used, the reliability of the semiconductor laser device can be improved. In the case where a surface of the molded resin is roughened, the resin and the laser chip are joined together. Therefore, even when the resin is peeled off for some reason, the wire connecting the laser chip and the resin section is broken and thus safety for the eyes is guaranteed.

The laser chip is immersed in a resin material, and then the resin material is cured while a surface of the resin section formed by curing is roughened. In this manner, various types of resin sections can be formed by merely changing the design of the mold without requiring any other extra step. Thus, a semiconductor laser device can be produced at lower cost. Alternatively, a surface of the resin section is roughened by etching, by polishing, or by pressing a mold having a rough surface to the surface of the resin section. In this manner, a semiconductor laser device can be produced using a conventional mounting process of a conventional light emitting diode, with the addition of a simple process after the curing to form a mold.

In the case where the resin section is formed of a birefringent resin material and a surface of the resin section is roughened, the light-diffusive function of the resin material itself and the light-diffusive function provided by the roughening of the surface are combined to diffuse light more efficiently. Thus, a semiconductor laser device which is more stable in terms of safety can be provided. Since the laser chip can be directly immersed in the birefringent resin material without first curing another resin material, the productivity of the semiconductor laser device can be increased.

In another embodiment of the invention, the resin section and the diffusive plate are integrated together. Therefore, the diffusive plate is unlikely to be broken and thus safety for the eyes can be guaranteed. In the case where the laser chip and the resin section are provided so as not to contact each other, stress-derived strain provided from the resin section to the laser chip due to a change in environmental temperature or the like is avoided. Thus, the reliability of the semiconductor laser device can be improved.

In still another embodiment of the invention, the light is diffused by a difference in refractive index between different materials contained in the resin section. Thus, there is no possibility of the undesirable characteristics of the conventional devices, such as breakage of the diffusive plate occurring, and therefore safety for the eyes is guaranteed. Even when a moisture permeable diffusive material such as a silica resin or the like is used, the reliability of the semiconductor laser device is not reduced since the laser chip and the resin section do not contact each other. Stress-derived strain provided from the resin section to the laser chip due to a change in environmental temperature or the like is avoided. In the case where the resin section has a shape of a lens, the radiation angle pattern is controlled by the lens effect. Thus, the light can radiate to the outside space over a larger angle. Since safety for the eyes is defined by the optical power or optical power density of light incident on the pupil, it is very effective to be able to control the radiation angle distribution by the lens effect. A semiconductor laser device having such a structure can be produced by a typical semiconductor laser device production process and molding step. Therefore, a compact semiconductor laser package which can guarantee safety for the eyes can be obtained. Since the radiation angle pattern can be controlled by the lens effect, such a semiconductor laser device can be easily connected to an optical fiber or the like.

Alternatively, a resin section formed of a birefringent resin material is provided. In this manner, the refractive index is varied in accordance with the polarization state of the incident light. The light is diffused by the difference in refractive index, and thus coherency of the radiating light can be reduced to guarantee safety for the eyes. Unlike conventional devices, the problem of the reliability of the semiconductor laser device being lowered by use of the silica-based resin does not occur. Even when the laser chip is not directly immersed in a resin material without first curing another resin material, the light output efficiency can be increased to improve the light intensity/power consumption ratio due to the high light transmittance of the resin material. Thus, the power consumption can be reduced and the reliability of the device can be enhanced.

In the case where an area at the center and in the vicinity of a surface of the resin section, the surface facing the laser chip, is a curved surface having a light outgoing point of the laser chip as the center of curvature, the output efficiency of the S polarization can be increased. This is especially effective when a laser chip having a small beam expansion angle is used.

In the case where an area at the center and in the vicinity of a surface of the resin section, the surface facing the laser chip, is formed to be a curved surface having a light outgoing point of the laser chip as the center of curvature, and a peripheral area is formed to be a curved surface having the center of curvature on the opposite side to the laser chip, light can be output efficiently in accordance with the polarization state of the light.

In the case where an area at a center and in the vicinity of a surface of the resin section, the surface facing the laser chip, is formed to be substantially flat and a peripheral area is formed to be convex, light can be output from the diffusive plate more efficiently.

In the case where the normal to at least a light passing area of the convex area of the resin section is at an angle of larger than 0° and 3° or smaller with respect to a peak vector of a light beam emitted from the laser chip, the light output efficiency is further improved.

In the case where an area at a center and in the vicinity of a surface of the resin section, the surface facing the laser chip, is formed to be substantially flat and a peripheral area is roughened, the light output efficiency can be easily improved without detailed design.

In still another embodiment of the invention, a resin section includes an area formed of a resin material in which another resin material having a different refractive index from that of the first resin material is mixed. This area is provided with a light-diffusive function. Thus, the inconvenience of the diffusive plate being broken does not occur, unlike the case of using a conventional diffusive plate, and safety of eye is guaranteed. Even when a diffusive material such as a silica resin or the like is used, the reliability of the semiconductor laser device can be improved since the area does not contact the laser chip. This area can be easily formed by placing a resin material, containing another resin material having a different refractive index from that of the first resin material, into a mold and first curing the resin, and then placing a resin material containing no resin material having a different refractive index into the mold and curing the resin.

Alternatively, a resin section including an area formed of a birefringent resin material is provided. Thus, light is diffused by a refractive index which varies in accordance with the polarization state of the incident light. Coherency of the radiating light can be reduced to guarantee safety for the eyes. Unlike conventional devices, the problem of the reliability of the semiconductor laser device being lowered by the silica-based resin does not occur. Even when the laser chip is not directly immersed in a resin material without first curing another resin material, the light output efficiency can be increased to improve the light intensity/power consumption ratio due to the high light transmittance of the resin material. Thus, the power consumption can be reduced and the reliability of the device can be enhanced.

In still another embodiment of the invention, a resin section formed of a birefringent resin material and a laser chip are integrated together. Thus, light is diffused by a refractive index which varies in accordance with the polarization state of the incident light. Coherency of the radiating light can be reduced. Since the birefringent resin material is not moisture permeable unlike a silica resin or the like, the laser chip can be directly immersed in the birefringent resin material without first curing another resin material. Therefore, the productivity of the semiconductor laser device can be increased.

In the case where an aromatic polyester is used as the birefringent resin material, a semiconductor laser device is provided which has a superior heat resistance and moisture resistance and a satisfactory light output efficiency, and emits light with high safety for the eyes.

Using a semiconductor laser device according to the present invention, an optical communication system and an optical sensor system which guarantees safety for the eyes and has satisfactory reliability can be realized. A semiconductor laser device according to the present invention is effectively used for a light source which is directly viewed by humans.

What is claimed is:

1. A semiconductor laser device including a resin section in which a light-diffusive surface thereof is entirely or partially roughened, or a surface thereof facing a laser chip is entirely or partially roughened, wherein the roughened portion of the resin section diffuses light so as to reduce coherency of the radiating light, and the resin section has a lens function so that a direction in which the radiating light from the laser chip propagates is changed and the light radiates over a prescribed range of angles.

2. A semiconductor laser device according to claim 1, wherein the resin section is formed of a birefringent resin material.

3. A semiconductor laser device according to claim 2, wherein a relationship of $\Delta n/n^2 > 0.0015$ is fulfilled, where $\Delta n$ is an inherent birefringence value of light having an oscillating wavelength of the semiconductor laser device and n is an average refractive index for light having the oscillating wavelength.

4. A semiconductor laser device according to claim 2, wherein the birefringent resin material is one material, a polymer blend of at least two materials, or a polymer blend containing at least one material of polyimide, polycarbonate, polyallylate, polyethersulfone, polyphenylene sulfide, polyphenylene oxide, polyallyl sulfone, polyamideimide, polyolefin, polyacrylonitrile, cellulose and polyester.

5. A semiconductor laser device according to claim 2, wherein the birefringent resin material is an aromatic polyester.

6. An optical communication system comprising a semiconductor laser device according to claim 1.

7. An optical sensor system comprising a semiconductor laser device according to claim 1.

8. A semiconductor laser device including a resin section for integrating a container accommodating a laser chip and a diffusive plate having a light-diffusive function, wherein the diffusive-plate diffuses light so as to reduce coherency of the radiating light.

9. A semiconductor laser device according to claim 8, wherein an area at a center and in the vicinity thereof of a surface of the resin section facing the laser chip is a curved surface having a light outgoing point of the laser chip as the center of curvature.

10. A semiconductor laser device according to claim 9, wherein a peripheral area of the surface of the resin section facing the laser chip is a curved surface having the center of curvature on a side opposite to the laser chip.

11. A semiconductor laser device according to claim 8, wherein an area at a center and in the vicinity of a surface of the resin section facing the laser chip is substantially flat and a peripheral area is convex.

12. A semiconductor laser device according to claim 11, wherein a normal to at least a light passing area of the convex area of the resin section is at an angle of larger than 0° and 3° or smaller with respect to a peak vector of a light beam emitted from the laser chip.

13. A semiconductor laser device according to claim 8, wherein an area at a center and in the vicinity of a surface of the resin section facing the laser chip is substantially flat and a peripheral area is roughened.

14. A semiconductor laser device according to claim 8, wherein the resin section is formed of a birefringent resin material.

15. A semiconductor laser device according to claim 14, wherein a relationship of $\Delta n/n^2 > 0.0015$ is fulfilled, where $\Delta n$ is an inherent birefringence value of light having an oscillating wavelength of the semiconductor laser device and n is an average refractive index for light having the oscillating wavelength.

16. A semiconductor laser device according to claim 14, wherein the birefringent resin material is one material, a polymer blend of at least two materials, or a polymer blend containing at least one material of polyimide, polycarbonate, polyallylate, polyethersulfone, polyphenylene sulfide, polyphenylene oxide, polyallyl sulfone, polyamideimide, polyolefin, polyacrylonitrile, cellulose and polyester.

17. A semiconductor laser device according to claim 14, wherein the birefringent resin material is an aromatic polyester.

18. A semiconductor laser device according to claim 8, wherein in the resin section, a material having a different refractive index is mixed, or the resin section is formed of a material having birefringence.

19. A semiconductor laser device including a resin section for integrating a container accommodating a laser chip and a sealing member having a light-diffusive function, wherein the sealing member diffuses light so as to reduce coherency of the radiating light, and the resin section has a lens function so that a direction in which the radiating light from the laser chip propagates is changed and the light radiates over a prescribed range of angles.

20. A semiconductor laser device according to claim 19, wherein an area at a center and in the vicinity thereof of a surface of the resin section facing the laser chip is a curved surface having a light outgoing point of the laser chip as the center of curvature.

21. A semiconductor laser device according to claim 20, wherein a peripheral area of the surface of the resin section facing the laser chip is a curved surface having the center of curvature on a side opposite to the laser chip.

22. A semiconductor laser device according to claim 19, wherein an area at a center and in the vicinity of a surface of the resin section facing the laser chip is substantially flat and a peripheral area is convex.

23. A semiconductor laser device according to claim 22, wherein a normal to at least a light passing area of the convex area of the resin section is at an angle of larger than 0° and 3° or smaller with respect to a peak vector of a light beam emitted from the laser chip.

24. A semiconductor laser device according to claim 19, wherein an area at a center and in the vicinity of a surface of the resin section facing the laser chip is substantially flat and a peripheral area is roughened.

25. A semiconductor laser device according to claim 19, wherein the resin section is formed of a birefringent resin material.

26. A semiconductor laser device according to claim 25, wherein a relationship of $\Delta n/n^2 > 0.0015$ is fulfilled, where $\Delta n$ is an inherent birefringence value of light having an oscillating wavelength of the semiconductor laser device and n is an average refractive index for light having the oscillating wavelength.

27. A semiconductor laser device according to claim 25, wherein the birefringent resin material is one material, a polymer blend of at least two materials, or a polymer blend containing at least one material of polyimide, polycarbonate, polyallylate, polyethersulfone, polyphenylene sulfide, polyphenylene oxide, polyallyl sulfone, polyamideimide, polyolefin, polyacrylonitrile, cellulose and polyester.

28. A semiconductor laser device according to claim 25, wherein the birefringent resin material is an aromatic polyester.

29. A semiconductor laser device according to claim 19, wherein in the resin section, a material having a different refractive index is mixed, or the resin section is formed of a material having birefringent.

30. A semiconductor laser device including a resin section formed of a first resin material in which a different resin material having a different refractive index from that of the first resin material is mixed or a resin section formed of a birefringent resin material, the resin section being provided so as not to contact a laser chip, wherein the resin section diffuses light so as to reduce coherency of the radiating light.

31. A semiconductor laser device according to claim 30, wherein an area at a center and in the vicinity thereof of a surface of the resin section facing the laser chip is a curved surface having a light outgoing point of the laser chip as the center of curvature.

32. A semiconductor laser device according to claim 31, wherein a peripheral area of the surface of the resin section facing the laser chip is a curved surface having the center of curvature on a side opposite to the laser chip.

33. A semiconductor laser device according to claim 30, wherein an area at a center and in the vicinity of a surface of the resin section facing the laser chip is substantially flat and a peripheral area is convex.

34. A semiconductor laser device according to claim 33, wherein a normal to at least a light passing area of the convex area of the resin section is at an angle of larger than 0° and 3° or smaller with respect to a peak vector of a light beam emitted from the laser chip.

35. A semiconductor laser device according to claim 30, wherein an area at a center and in the vicinity of a surface of the resin section facing the laser chip is substantially flat and a peripheral area is roughened.

36. A semiconductor laser device according to claim 30, wherein a relationship of $\Delta n/n^2 > 0.0015$ is fulfilled, where $\Delta n$ is an inherent birefringence value of light having an oscillating wavelength of the semiconductor laser device and n is an average refractive index for light having the oscillating wavelength.

37. A semiconductor laser device according to claim 30, wherein the birefringent resin material is one material, a polymer blend of at least two materials, or a polymer blend containing at least one material of polyimide, polycarbonate, polyallylate, polyethersulfone, polyphenylene sulfide, polyphenylene oxide, polyallyl sulfone, polyamideimide, polyolefin, polyacrylonitrile, cellulose and polyester.

38. A semiconductor laser device according to claim 30, wherein the birefringent resin material is an aromatic polyester.

39. A semiconductor laser device according to claim 38, wherein the aromatic polyester is polyallylate or polycarbonate.

40. A semiconductor laser device according to claim 39, wherein the aromatic polyester is polyallylate obtained from a divalent phenol compound represented by chemical formula (I) and an aromatic dicarboxylic acid or polycarbonate obtained from the phenol compound and phosgene:

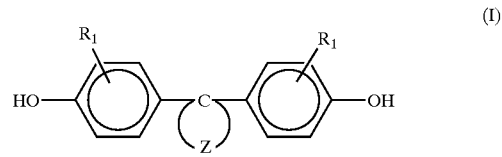

(I)

41. A semiconductor laser device including a resin section formed of a first resin material in which a different resin material having a different refractive index from that of the first resin material is mixed, and a laser chip, the resin section and the laser chip being provided so that the material does not contact a light emitting point of the laser chip, wherein the resin section diffuses light so as to reduce coherence of the radiating light.

42. A semiconductor laser device according to claim 41, wherein the birefringent resin material is one material, a polymer blend of at least two materials, or a polymer blend containing at least one material of polyimide, polycarbonate, polyallylate, polyethersulfone, polyphenylene sulfide, polyphenylene oxide, polyallyl sulfone, polyamideimide, polyolefin, polyacrylonitrile, cellulose and polyester.

43. A semiconductor laser device according to claim 41, wherein an area at a center and in the vicinity thereof of a surface of the resin section facing the laser chip is a curved surface having a light outgoing point of the laser chip as the center of curvature.

44. A semiconductor laser device according to claim 43 wherein a peripheral area of the surface of the resin section facing the laser chip is a curved surface having the center of curvature on a side opposite to the laser chip.

45. A semiconductor laser device according to claim 41, wherein an area at a center and in the vicinity of a surface of the resin section facing the laser chip is substantially flat and a peripheral area is convex.

46. A semiconductor laser device according to claim 45, wherein a normal to at least a light passing area of the convex area of the resin section is at an angle of larger than 0° and 3° or smaller with respect to a peak vector of a light beam emitted from the laser chip.

47. A semiconductor laser device according to claim 41, wherein an area at a center and in the vicinity of a surface of the resin section facing the laser chip is substantially flat and a peripheral area is roughened.

48. A semiconductor laser device according to claim 41, wherein the resin section is formed of a birefringent resin material.

49. A semiconductor laser device according to claim 48, wherein a relationship of $\Delta n/n^2 > 0.0015$ is fulfilled, where $\Delta n$ is an inherent birefringence value of light having an oscillating wavelength of the semiconductor laser device and n is an average refractive index for light having the oscillating wavelength.

50. A semiconductor laser device according to claim 48, wherein the birefringent resin material is one material, a polymer blend of at least two materials, or a polymer blend containing at least one material of polyimide, polycarbonate, polyallylate, polyethersulfone, polyphenylene sulfide, polyphenylene oxide, polyallyl sulfone, polyamideimide, polyolefin, polyacrylonitrile, cellulose and polyester.

51. A semiconductor laser device according to claim 48, wherein the birefringent resin material is an aromatic polyester.

52. A semiconductor laser device according to claim 41, wherein a relationship of $\Delta n/n^2 > 0.0015$ is fulfilled, where $\Delta n$ is an inherent birefringence value of light having an oscillating wavelength of the semiconductor laser device and n is an average refractive index for light having the oscillating wavelength.

53. A semiconductor laser device according to claim 41, wherein the birefringent resin material is an aromatic polyester.

54. A semiconductor laser device including a resin section, a portion of which is an area formed of a first resin material in which a different resin material having a different refractive index from that of the first resin material is mixed or an area formed of a birefringent resin material, the area being provided so as not to contact a laser chip, wherein the area diffuses light so as to reduce coherency of the radiating light.

55. A semiconductor laser device according to claim 54, wherein an area at a center and in the vicinity thereof of a surface of the resin section facing the laser chip is a curved surface having a light outgoing point of the laser chip as the center of curvature.

56. A semiconductor laser device according to claim 55, wherein a peripheral area of the surface of the resin section facing the laser chip is a curved surface having the center of curvature on a side opposite to the laser chip.

57. A semiconductor laser device according to claim 54, wherein an area at a center and in the vicinity of a surface of the resin section facing the laser chip is substantially flat and a peripheral area is convex.

58. A semiconductor laser device according to claim 57, wherein a normal to at least a light, passing area of the convex area of the resin section is at an angle of larger than 0° and 3° or smaller with respect to a peak vector of a light beam emitted from the laser chip.

59. A semiconductor laser device according to claim 54, wherein an area at a center and in the vicinity of a surface of the resin section facing the laser chip is substantially flat and a peripheral area is roughened.

60. A semiconductor laser device according to claim 54, wherein a relationship of $\Delta n/n^2 > 0.0015$ is fulfilled, where $\Delta n$ is an inherent birefringence value of light having an oscillating wavelength of the semiconductor laser device and n is an average refractive index for light having the oscillating wavelength.

61. A semiconductor laser device according to claim 54, wherein the birefringent resin material is one material, a polymer blend of at least two materials, or a polymer blend containing at least one material of polyimide, polycarbonate, polyallylate, polyethersulfone, polyphenylene sulfide, polyphenylene oxide, polyallyl sulfone, polyamideimide, polyolefin, polyacrylonitrile, cellulose and polyester.

62. A semiconductor laser device according to claim 54, wherein the birefringent resin material is an aromatic polyester.

63. A semiconductor laser device including a resin section, a portion of which is an area formed of a first resin material in which a different resin material having a different refractive index from that of the first resin material is mixed, and a laser chip, the resin section and the laser chip being provided so that the material does not contact a light emitting point of the laser chip, wherein the resin section diffuses light so as to reduce coherence of the radiating light.

64. A semiconductor laser device according to claim 63, wherein an area at a center and in the vicinity thereof of a surface of the resin section facing the laser chip is a curved surface having a light outgoing point of the laser chip as the center of curvature.

65. A semiconductor laser device according to claim 64, wherein a peripheral area of the surface of the resin section facing the laser chip is a curved surface having the center of curvature on a side opposite to the laser chip.

66. A semiconductor laser device according to claim 63, wherein an area at a center and in the vicinity of a surface of the resin section facing the laser chip is substantially flat and a peripheral area is convex.

67. A semiconductor laser device according to claim 66, wherein a normal to at least a light passing area of the convex area of the resin section is at an angle of larger than 0° and 3° or smaller with respect to a peak vector of a light beam emitted from the laser chip.

68. A semiconductor laser device according to claim 63, wherein an area at a center and in the vicinity of a surface of the resin section facing the laser chip is substantially flat and a peripheral area is roughened.

69. A semiconductor laser device according to claim 63, wherein the resin section is formed of a birefringent resin material.

70. A semiconductor laser device according to claim 69, wherein a relationship of $\Delta n/n^2 > 0.0015$ is fulfilled, where $\Delta n$ is an inherent birefringence value of light having an oscillating wavelength of the semiconductor laser device and n is an average refractive index for light having the oscillating wavelength.

71. A semiconductor laser device according to claim 69, wherein the birefringent resin material is one material, a polymer blend of at least two materials, or a polymer blend containing at least one material of polyimide, polycarbonate, polyallylate, polyethersulfone, polyphenylene sulfide, polyphenylene oxide, polyallyl sulfone, polyamideimide, polyolefin, polyacrylonitrile, cellulose and polyester.

72. A semiconductor laser device according to claim 69, wherein the birefringent resin material is an aromatic polyester.

73. A semiconductor laser device according to claim 63, wherein a relationship of $\Delta n/n^2 > 0.0015$ is fulfilled, where $\Delta n$ is an inherent birefringence value of light having an oscillating wavelength of the semiconductor laser device and n is an average refractive index for light having the oscillating wavelength.

74. A semiconductor laser device according to claim 63, wherein the birefringent resin material is one material, a polymer blend of at least two materials, or a polymer blend containing at least one material of polyimide, polycarbonate, polyallylate, polyethersulfone, polyphenylene sulfide, polyphenylene oxide, polyallyl sulfone, polyamideimide, polyolefin, polyacrylonitrile, cellulose and polyester.

75. A semiconductor laser device according to claim 63, wherein the birefringent resin material is an aromatic polyester.

76. A semiconductor laser device including a resin section formed of a birefringent resin material and a laser chip integrated together, wherein the resin section diffuses light so as to reduce coherency of the radiating light.

77. A semiconductor laser device according to claim 76, wherein a relationship of $\Delta n/n^2 > 0.0015$ is fulfilled, where $\Delta n$ is an inherent birefringence value of light having an oscillating wavelength of the semiconductor laser device and n is an average refractive index for light having the oscillating wavelength.

78. A semiconductor laser device according to claim 76, wherein the birefringent resin material is one material, a polymer blend of at least two materials, or a polymer blend containing at least one material of polyimide, polycarbonate, polyallylate, polyethersulfone, polyphenylene sulfide, polyphenylene oxide, polyallyl sulfone, polyamideimide, polyolefin, polyacrylonitrile, cellulose and polyester.

79. A semiconductor laser device according to claim 76, wherein the birefringent resin material is an aromatic polyester.

80. A method for producing a semiconductor laser device including a resin section in which a light-diffusive surface thereof is entirely or partially roughened, or a surface thereof facing a laser chip is entirely or partially roughened, so as to reduce coherency of radiating light, the method comprising the steps of:

immersing a laser chip or a container accommodating a laser chip in a resin material; and curing the resin material and roughening a corresponding portion.

81. A method for producing a semiconductor laser device including a resin section in which a light-diffusive surface thereof is entirely or partially roughened, or a surface thereof facing a laser chip is entirely or partially roughened, so as to reduce coherence of radiating light, the method comprising the steps of:

immersing a laser chip or a container accommodating a laser chip in a resin material and curing the resin material; and roughening a corresponding portion of the cured resin material.

82. A method for producing a semiconductor laser device according to claim 81, wherein the step of roughening the intended portion of the cured resin material is performed by etching, polishing, or pressing a mold having a rough surface to the corresponding portion.

83. A semiconductor laser device including a resin section in which a material having a different refractive index is mixed so as to partially change the concentration, or a resin section formed of a material having birefringence wherein the refractive index is varied in accordance with the polarization state of the incident light, the resin section being provided so as not to contact a laser chip, wherein the resin section diffuses light to reduce coherency of the radiating light.

* * * * *